United States Patent
Sakai

(10) Patent No.: US 9,831,126 B2
(45) Date of Patent: Nov. 28, 2017

(54) METHOD OF MANUFACTURING SEMICONDUCTOR DEVICE, SEMICONDUCTOR SUBSTRATE, AND SEMICONDUCTOR DEVICE

(71) Applicant: Sumitomo Electric Industries, Ltd., Osaka-shi (JP)

(72) Inventor: Mitsuhiko Sakai, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 76 days.

(21) Appl. No.: 14/699,688

(22) Filed: Apr. 29, 2015

(65) Prior Publication Data
US 2015/0371902 A1    Dec. 24, 2015
US 2017/0154818 A9    Jun. 1, 2017

(30) Foreign Application Priority Data
Jun. 23, 2014 (JP) .................. 2014-128109

(51) Int. Cl.
H01L 21/00    (2006.01)
H01L 21/78    (2006.01)
H01L 21/304    (2006.01)
H01L 21/283    (2006.01)
H01L 21/268    (2006.01)
H01L 29/06    (2006.01)

(52) U.S. Cl.
CPC ............ *H01L 21/78* (2013.01); *H01L 21/268* (2013.01); *H01L 21/283* (2013.01); *H01L 21/304* (2013.01); *H01L 29/0657* (2013.01)

(58) Field of Classification Search
CPC .................................................. H01L 21/304
See application file for complete search history.

(56) References Cited

U.S. PATENT DOCUMENTS

| | | | | |
|---|---|---|---|---|
| 5,952,679 A | * | 9/1999 | Kitou | H01L 21/046 257/622 |
| 6,403,449 B1 | * | 6/2002 | Ball | H01L 21/3043 257/E21.238 |
| 2003/0216009 A1 | * | 11/2003 | Matsuura | H01L 23/544 438/460 |
| 2007/0066039 A1 | * | 3/2007 | Agarwal | H01L 21/0485 438/534 |

FOREIGN PATENT DOCUMENTS

JP    2007-019478 A    1/2007

* cited by examiner

*Primary Examiner* — William Harriston
(74) *Attorney, Agent, or Firm* — Venable LLP; Michael A. Sartori; Miguel A. Lopez

(57) ABSTRACT

A method of manufacturing a semiconductor device includes the steps of preparing a semiconductor substrate including a semiconductor layer having a first main surface and a second main surface located opposite to the first main surface and an epitaxial layer formed on the first main surface, forming a trench having a sidewall passing through the epitaxial layer and reaching the semiconductor layer and a bottom portion continuing to the sidewall and located in the semiconductor layer, decreasing a thickness of the semiconductor layer by grinding the second main surface, forming an electrode layer on the ground second main surface, achieving ohmic contact between the second main surface and the electrode layer by laser annealing, and obtaining individual substrates by forming a cutting portion along the trench and dividing the semiconductor substrate along the cutting portion.

5 Claims, 8 Drawing Sheets

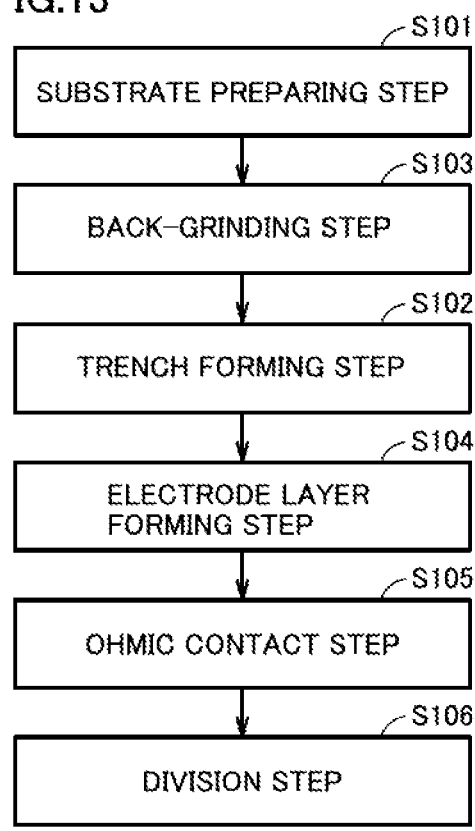

US 9,831,126 B2

METHOD OF MANUFACTURING SEMICONDUCTOR DEVICE, SEMICONDUCTOR SUBSTRATE, AND SEMICONDUCTOR DEVICE

BACKGROUND OF THE INVENTION

Field of the Invention

The present invention relates to a method of manufacturing a semiconductor device, a semiconductor substrate, and a semiconductor device.

Description of the Background Art

Generally in a process for manufacturing a semiconductor device, machining (what is called dicing) for cutting chips from a semiconductor substrate (a wafer) having an integrated circuit formed is carried out (see, for example, Japanese Patent Laying-Open No. 2007-019478).

SUMMARY OF THE INVENTION

Japanese Patent Laying-Open No. 2007-019478 has proposed such as cutting method that a cutting edge of a dicing blade does not reach a backside surface of a semiconductor substrate in dicing of a peripheral portion of the semiconductor substrate. According to Japanese Patent Laying-Open No. 2007-019478, with this method, scattering of chippings at the time of dicing is prevented, yield of semiconductor devices is improved, and necessity for back-grinding also referred to as "BG") carried out for enhancing adhesion between a substrate and a dicing tape is obviated.

In a process, for example, for manufacturing a power device, however, back-grinding is a process necessary for lowering ON resistance or maintaining a breakdown voltage, and handling of a substrate decreased in thickness through back-grinding has become an important factor affecting yield of semiconductor devices.

When a substrate is decreased in thickness through back-grinding, warpage is caused in the substrate, which adversely affects all subsequent processes such as suction fixing, transportation, film formation, heat treatment, and dicing. Such a disadvantage is noticeable, for example, in a material high in hardness such as silicon carbide (SiC) or a large-diameter substrate not smaller than 6 inches, and interfere reduction of costs for next-generation power devices and widespread use thereof.

In view of the circumstances above, it is an object to lessen warpage of a semiconductor substrate and improve yield of semiconductor devices in a method of manufacturing a semiconductor device which includes a step of decreasing a thickness of a semiconductor substrate by grinding the semiconductor substrate.

A method of manufacturing a semiconductor device according to one embodiment of the present invention includes the steps of preparing a semiconductor substrate including a semiconductor layer having a first main surface and a second main surface located opposite to the first main surface and an epitaxial layer formed on the first main surface, forming a trench having sidewall passing through the epitaxial layer and reaching the semiconductor layer and a bottom portion continuing to the sidewall and located in the semiconductor layer, and decreasing a thickness of the semiconductor layer by grinding the second main surface. An amount of warpage of the semiconductor substrate is not greater than 400 μm by forming the trench. The method of manufacturing a semiconductor device further includes the steps of forming an electrode layer on the ground second main surface, achieving ohmic contact between the second main surface and the electrode layer by laser annealing, and obtaining individual substrates by forming a cutting portion along the trench and dividing the semiconductor substrate along the cutting portion.

A semiconductor substrate according to one embodiment of the present invention has a diameter not smaller than 150 mm and includes a semiconductor layer having a first main surface and a second main surface located opposite to the first main surface and an epitaxial layer formed on the first main surface. The semiconductor substrate further includes a trench having sidewall passing through the epitaxial layer and reaching the semiconductor layer and a bottom portion continuing to the sidewall and located in the semiconductor layer, and an amount of warpage is not greater than 400 μm.

A semiconductor device according to one embodiment of the present invention includes an individual substrate including a semiconductor layer having a first main surface and a second main surface located opposite to the first main surface and an epitaxial layer formed on the first main surface, and has a step at an end portion of the semiconductor layer.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 13 is a flowchart showing another overview of a method of manufacturing as semiconductor device according to one embodiment of the present invention.

DESCRIPTION OF THE PREFERRED EMBODIMENTS

Figure 1:
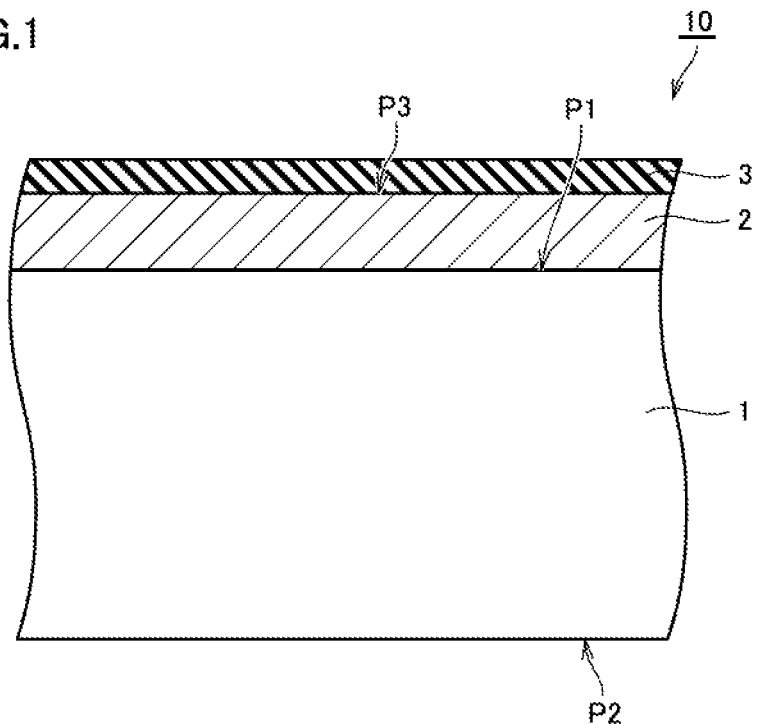
FIG. 1 is a schematic partial cross-sectional view illustrating a substrate preparing step according to one embodiment of the present invention.

Description of Embodiment of the Present Invention

Embodiments of the present invention will initially be listed and explained.

[1] A method of manufacturing a semiconductor device according to one embodiment of the present invention includes the steps of preparing a semiconductor substrate 10 including a semiconductor layer 1 having a first main surface P1 and a second main surface P2 located opposite to first main surface P1 and an epitaxial layer 2 formed on first main surface P1 (S101), forming a trench TR having a sidewall SW passing through epitaxial layer 2 and reaching semiconductor layer 1 and a bottom portion BT continuing to sidewall SW and located in semiconductor layer 1 (S102), and decreasing a thickness of semiconductor layer 1 by grinding second main surface P2 (S103). An amount of warpage of semiconductor substrate 10 is not greater than 400 µm by forming trench TR. The method of manufacturing a semiconductor device further includes the steps of forming an electrode layer 4a on ground second main surface P2 (S104), achieving ohmic contact between second main surface P2 and electrode layer 4a by laser annealing (S105), and obtaining individual substrates 100 by forming a cutting portion CP along trench TR and dividing semiconductor substrate 10 along cutting portion CP (S106).

With the manufacturing method above, semiconductor layer 1 is decreased in thickness by grinding second main surface P2 (a backside surface). Thus, a semiconductor device low in ON resistance can be realized. When second main surface P2 is ground, a residual stress in a process-damaged layer generated as a result of grinding and a residual stress accumulated in epitaxial layer 2 are combined to lead to large warpage of semiconductor substrate 10. Therefore, yield is normally lowered.

Then, in the manufacturing method above, before or after back-grinding, trench TR passing through epitaxial layer 2 is formed from a side of epitaxial layer 2. Formation of trench TR can eliminate the residual stress and an amount of warpage of semiconductor substrate 10 can be controlled to 400 µm or smaller. Thus, transportation or the like of semiconductor substrate 10 is facilitated and yield is improved. As trench TR passes through epitaxial layer 2, even though a crack is produced in epitaxial layer 2, the crack cannot propagate through epitaxial layer 2 and damages can be minimized.

Trench TR, however, should have such a depth as not reaching second main surface P2 (the backside surface), because, when trench TR reaches the backside surface, a new disadvantage arises. In the manufacturing method above, laser annealing is adopted as a method of achieving ohmic contact. Thus, ohmic contact can be achieved around a room temperature, and warpage of the substrate can be suppressed as compared with a case that ohmic contact is achieved through heat treatment at a high temperature.

If trench TR reaches second main surface P2, laser beams impinge onto a base of a laser annealing apparatus through trench TR and the base is damaged each time of laser annealing. In addition, dust and chippings generated as a result of melting of a surface of the base scatter, and yield of semiconductor devices may lower. Therefore, in the manufacturing method above, bottom portion BT of trench TR is restricted to be located in semiconductor layer 1.

Thereafter, cutting portion CP is formed along trench TR, so that semiconductor substrate 10 can readily be divided into individual substrates 100 (chips).

As set forth above, according to the manufacturing method in [1] above, warpage of semiconductor substrate 10 can be lessened and yield of semiconductor devices can be improved.

Figure 11:
FIG. 11 is a schematic cross-sectional view for illustrating an amount of warpage of the semiconductor substrate according to one embodiment of the present invention.

Here, an "amount of warpage" is defined by a length between a highest point and a lowest point in a direction of thickness of semiconductor substrate 10, as shown in FIG. 11.

[2] Preferably, a width W1 of trench TR is greater than a width W2 of cutting portion CP, in order to further facilitate division of semiconductor substrate 10.

[3] Preferably, a condition of D>0.5 T is satisfied, where T represents a distance in a direction of thickness of semiconductor substrate 10 from a third main surface P3 of main surfaces of epitaxial layer 2, which is located opposite to the main surface in contact with first main surface P1, to ground second main surface P2 and D represents a depth from third main surface P3 to bottom portion BT, because an amount of warpage of semiconductor substrate 10 can further be lessened.

[4] Preferably, cutting portion CP is formed in bottom portion BT, at a distance from sidewall SW, in order to prevent generation of chippings due to contact of a blade to sidewall SW during dicing.

[5] Preferably, in the step (S102) of forming trench TR, trench TR is formed to extend across first main surface P1 from a first end portion E1 thereof to a second end portion E2 located opposite to first end portion E1.

Electrode layer 4a is formed, for example, with sputtering. Here, though the first main surface P1 side is protected by an adhesive tape, such a problem that an outgas generated during sputtering remains in between the adhesive tape and epitaxial layer 2, which leads to cracking of semiconductor substrate 10, has also been observed. Therefore, as above, trench TR is formed to extend across first main surface P1, so that trench TR functions as a path for emission of the outgas and cracking of the substrate can be prevented.

[6] One embodiment of the present invention also relates to a semiconductor substrate (a wafer), the semiconductor substrate is a substrate having a diameter R not smaller than 150 mm and including semiconductor layer 1 having first main surface P1 and second main surface P2 located opposite main surface P1 and epitaxial layer 2 formed on first main surface P1. The semiconductor substrate further includes trench TR having sidewall SW passing through epitaxial layer 2 and reaching semiconductor layer 1 and bottom portion BT continuing to sidewall SW and located in semiconductor layer 1, and an amount of warpage is not greater than 400 µm.

While this semiconductor substrate is a large-diameter substrate not smaller in diameter than 150 mm, an amount of warpage is suppressed to 400 µm or smaller owing to trench TR. Therefore, by employing this semiconductor substrate, cost for manufacturing semiconductor devices can be reduced and yield can be improved.

[7] In [6] above, the semiconductor substrate preferably has a thickness not greater than 150 µm. When a semiconductor substrate has a thickness not greater than 150 µm, ON resistance of a semiconductor device can be lowered. Normally, such a thin substrate is highly likely to warp, which leads to lower yield. According to [6], however, since an amount of warpage is controlled to 400 μm or smaller owing to trench TR, semiconductor devices can be manufactured without lowering in yield.

[8] One embodiment of the present invention also relates to a semiconductor device (a chip), and the semiconductor device includes individual substrate 100 including semiconductor layer 1 having first main surface P1 and second main surface P2 located opposite to first main surface P1 and epitaxial layer 2 formed on first main surface P1, and has a step SP at an end portion of semiconductor layer 1.

In this semiconductor device, since step SP is provided at the end portion of semiconductor layer 1, second main surface P2 is greater in area than first main surface P1. Therefore, during die-bonding, the semiconductor device can be fixed onto a support in a stable manner.

Details of Embodiments of the Present Invention

An embodiment of the present invention (hereinafter also denoted as the "present embodiment") will be described hereinafter in detail, however, the present embodiment is not limited thereto. In the description below, the same or corresponding elements have the same reference characters allotted and the same description thereof will not be repeated. In crystallographic denotation herein, an individual orientation, a group orientation, an individual plane, and a group plane are shown in [ ], < >, ( ), and { }, respectively. Moreover, a crystallographically negative index is normally expressed by a number with a bar "–" thereabove, however, it is herein expressed by a number preceded by a negative sign.

First Embodiment

Figure 12:
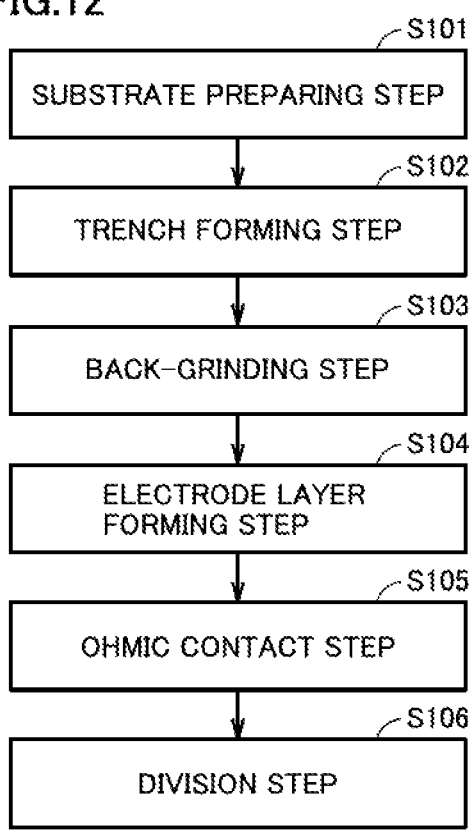
FIG. 12 is a flowchart showing overview of a method of manufacturing a semiconductor device according to one embodiment of the present invention.

A first embodiment is directed to a manufacturing method in the present embodiment. FIG. 12 is a flowchart showing overview of a method of manufacturing a semiconductor device. Referring to FIG. 12, the manufacturing method includes a substrate preparing step (S101), a trench forming step (S102), a back-grinding step (S103), an electrode layer forming step (S104), an ohmic contact step (S105) and a division step (S106). In the present embodiment, an order of the steps is not limited to the order shown in FIG. 12, and for example, as in the flowchart shown in FIG. 13, the trench forming step (S102) may be performed after the back-grinding step (S103). In any case, warpage of the substrate is lessened and yield is improved. The trench forming step (S102) is preferably performed before the back-grinding step (S103). This is because, by forming a trench in advance before the back-grinding step (S103) in which warpage occurs in the substrate, occurrence of warpage per se can be suppressed and yield can further be improved. Each step will be described below.

[Substrate Preparing Step (S101)]

In the substrate preparing step, semiconductor substrate 10 is prepared. FIG. 1 is a schematic partial cross-sectional view illustrating the substrate preparing step. Referring to FIG. 1, in this step, semiconductor substrate 10 including semiconductor layer 1 having first main surface P1 and second main surface P2 located opposite to first main surface P1 and epitaxial layer 2 formed on first main surface P1 is prepared.

Semiconductor substrate 10 has diameter R (see FIG. 4) preferably not smaller than 150 mm (for example, not smaller than 6 inches), more preferably not smaller than 175 mm (for example, not smaller than 7 inches), and particularly preferably not smaller than 200 mm (for example, not smaller than 8 inches), because semiconductor substrate 10 greater in diameter can contribute to cost reduction of a semiconductor device.

[Semiconductor Layer]

Semiconductor layer 1 can include such a semiconductor layer as an silicon (Si) layer, an SiC layer, a sapphire layer, a gallium nitride (GaN) layer, and a diamond layer. Semiconductor layer 1 may be formed from a single layer or may be constituted of a plurality of layers. For example, semiconductor layer 1 may be formed from a single SiC layer, or may be a stack in which a sapphire layer serves as an underlying layer and GaN layer is stacked thereon.

The present embodiment is effective for semiconductor substrate 10 including a semiconductor layer higher in hardness than an Si layer (a semiconductor layer having a Knoop hardness approximately not lower than 1000 kgf/mm$^2$). Conventionally, when warpage occurs in such a hard substrate as an SiC substrate, cracking has been likely and yield has lowered because the hard substrate has forcibly been constrained during transportation or the like. In the present embodiment, since occurrence of warpage per se can be suppressed, a material high in hardness such as SiC can also be employed. Here, Knoop harnesses of main semiconductor materials are listed as follows.

Si: from 560 to 710 kgf/mm$^2$
Sapphire: from 1600 to 2000 kgf/mm$^2$
SiC: from 2500 to 3200 kgf/mm$^2$
Diamond: from 7000 to 8000 kgf/mm$^2$ Therefore, semiconductor layer 1 has a hardness preferably not lower than 1000 kgf/mm$^2$, more preferably not lower than 1500 kgf/mm$^2$, further preferably not lower than 2000 kgf/mm$^2$, and most preferably not lower than 2500 kgf/mm$^2$.

Semiconductor layer 1 is prepared, for example, by slicing a single-crystal ingot. A single-crystal ingot is desirably sliced to a prescribed thickness, for example, with the use of a wire saw. After slicing, a main surface of semiconductor layer 1 may be polished. Here, semiconductor layer 1 has a thickness preferably not smaller than 300 μm and not greater than 700 μm, because, when the thickness is not smaller than 300 μm, an amount of warpage of semiconductor substrate 10 is decreased, and for example, generation of a thermal stress during ion implantation can be suppressed. By restricting, the thickness to 700 μm or smaller, undue cost can also be suppressed. Semiconductor layer 1 has a thickness more preferably not smaller than 400 μm and not greater than 600 μm and particularly preferably not smaller than 450 μm and not greater than 550 μm.

When an aimed semiconductor device is a power device, semiconductor layer 1 is preferably formed from a layer of SiC having polytype of 4H (hereinafter also denoted as "4H—SiC"). When semiconductor layer 1 is formed from a 4H—SiC layer, first main surface P1 which is a growth surface may be on a (0001) plane [what is called an Si plane] side or may be on a (000-1) plane [what is called a C plane] side. First main surface P1 is desirably a surface tilted by not smaller than 2° and not greater than 8° with respect to a {0001} plane. Namely, an off angle of semiconductor layer 1 with respect to the {0001} plane is desirably not smaller than 2° and not greater than 8° in order to suppress occurrence of basal plane dislocation in epitaxial layer 2 and to improve yield.

[Epitaxial Layer]

Epitaxial layer 2 is a semiconductor layer epitaxially grown on semiconductor layer 1. Epitaxial growth on semiconductor layer 1 can be carried out, for example, with chemical vapor deposition (CVD), molecular beam epitaxy (MBE), or liquid phase epitaxy (LPE).

In an example of 4H—SiC, for example, with CVD in which a gas mixture of silane (SiH$_4$) and propane (C$_3$H$_8$) is used as a source gas, epitaxial layer 2 of 4H—SiC can be grown on semiconductor layer 1. Here, epitaxial layer 2 may be doped, for example, with such an impurity as nitrogen (N) or phosphorus (P).

Epitaxial layer 2 has an impurity region (not shown) doped with donors or acceptors. The impurity region is formed, for example, by implanting ions from above a mask patterned through lithography. Implanted donors or acceptors are activated by annealing semiconductor substrate 10 at a prescribed temperature. Thereafter, an electrode layer or the like may be formed, depending on a structure of an aimed device.

In the present embodiment, an insulating film 3 (an interlayer insulating film of a passivation film) may further be formed on epitaxial layer 2 (third main surface P3). Insulating film 3 is formed, for example, from a silicon dioxide (SiO$_2$) film, a silicon nitride (SiN) film, a silicon oxynitride (SiON) film, or a resin film (for example, a polyimide film) and can be formed with CVD or sputtering. A residual stress tends to be accumulated also in insulating film 3, and normally, warpage of semiconductor substrate 10 is aggravated when insulating film 3 is formed. According to the present embodiment, however, formation of trench TR can eliminate not only a residual stress in epitaxial layer 2 but also a residual stress in insulating film 3.

[Trench Forming Step (S102)]

Figure 2:
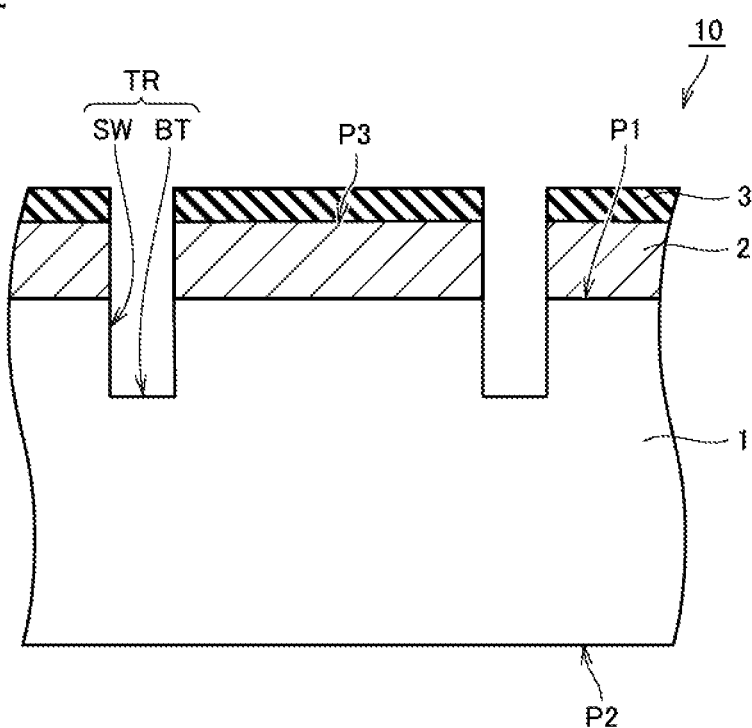
FIG. 2 is a schematic partial cross-sectional view illustrating a trench forming step according to one embodiment of the present invention.

FIG. 2 is a schematic partial cross-sectional view illustrating the trench forming step. Referring to FIG. 2, in this step, trench TR having sidewall SW passing through epitaxial layer 2 and reaching semiconductor layer 1 and bottom portion BT continuing to sidewall SW and located in semiconductor layer 1 is formed.

For forming trench TR, a general dicing saw can be employed. For a dicing blade, for example, a blade containing diamond abrasive grains in a cutting edge (what is called a diamond blade) can be employed. In this step, an amount of warpage of semiconductor substrate 10 is controlled to 400 μm or smaller by adjusting the number of trenches TR and a depth and a width of trench TR. In other words, in the present embodiment, so long as an amount of warpage of semiconductor substrate 10 can be controlled to 400 μm or smaller, the number of trenches TR and a depth and a width of trench TR can freely be set. For example, a single trench TR may be provided so long as an amount of warpage of semiconductor substrate 10 can be 400 μm or smaller. From a point of view of a processing time, a smaller number of trenches TR is preferred.

A smaller amount of warpage semiconductor substrate 10 can contribute to improvement in yield. Therefore, an amount of warpage of semiconductor substrate 10 is controlled more preferably to 300 μm or smaller and particularly preferably to 200 μm or smaller.

As will be described later, in the present embodiment, semiconductor substrate 10 can be divided within trench TR into chips. Therefore, the number of formed trenches TR desirably corresponds to the number of dicing lines such that trench TR coincides with a dicing line (cutting portion CP) which is formed later.

Figure 4:
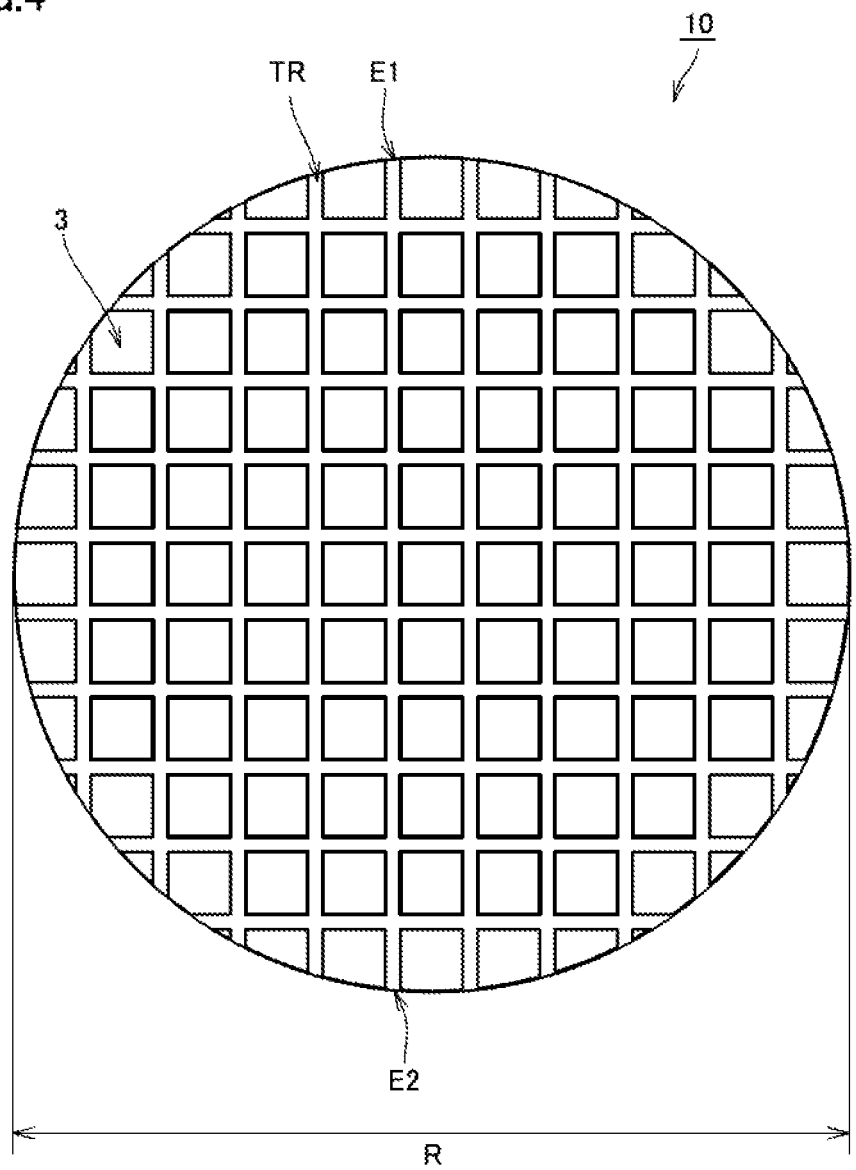
FIG. 4 is a schematic plan view showing one example of a construction of a semiconductor substrate according to one embodiment of the present invention.

FIG. 4 is a schematic plan view showing one example of a construction of semiconductor substrate 10 having trench TR formed (viewed from the first main surface P1 side). Referring to FIG. 4, trench TR is preferably formed to extend across first main surface P1 from first end portion E1 located in a periphery of first main surface P1 to second end portion E2 opposed to first end portion E1. Thus, in forming electrode layer 4a (see FIG. 5) which will be described later, for example, with sputtering, an outgas is emitted through trench TR and a disadvantage originating from the outgas (for example, cracking of a substrate due to remaining bubbles) can be prevented.

[Back-Grinding Step (S103)]

Figure 3:
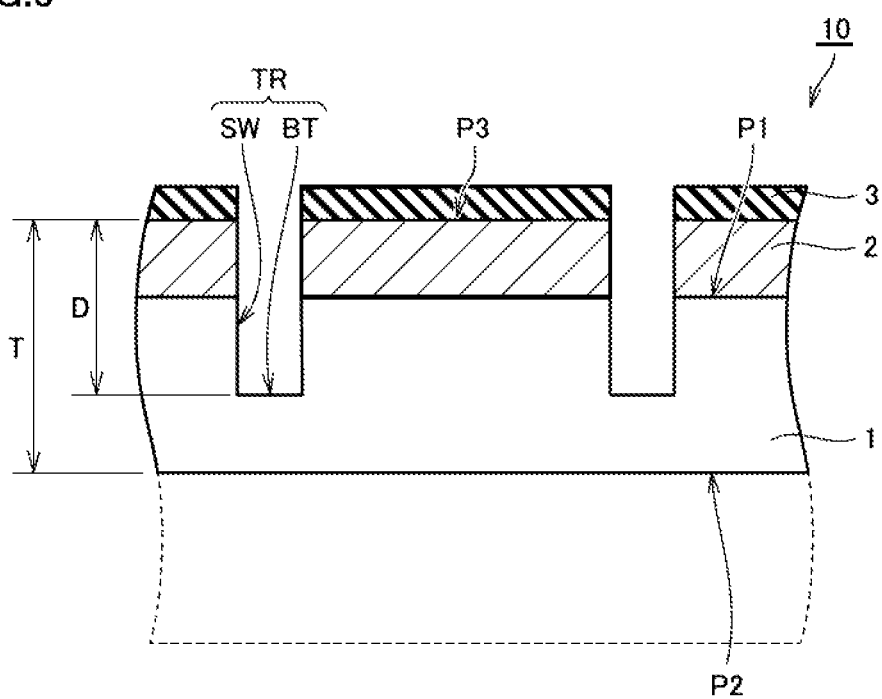
FIG. 3 is a schematic partial cross-sectional view illustrating a back-grinding step according to one embodiment of the present invention.

FIG. 1 is a schematic partial cross-sectional view illustrating the back-grinding step. Referring to FIG. 3, in this step, second main surface P2 is ground and semiconductor layer 1 is decreased in thickness. Thus, a resistive component derived from a thickness of semiconductor layer 1 can be reduced.

For back-grinding, a general grinding apparatus (a grinder) can be employed. For example, desirably, semiconductor substrate 10 is set to the grinder and second main surface P2 is ground while the first main surface P1 side is supported by an adhesive tape. In this step, for example, semiconductor substrate 10 having a thickness around 500 μm can be ground to a thickness not greater than 150 μm. Here, in order to further lower ON resistance of the semiconductor device, grinding to a thickness not greater than 125 μm is further preferred and grinding to a thickness not greater than 100 μm is particularly preferred.

Here, preferably, second main surface P2 is ground such that a condition of D>0.5 T is satisfied, where T represents a distance in a direction of thickness of semiconductor substrate 10 from third main surface P3 of main surfaces of epitaxial layer 2, which is located opposite to the main surface in contact with first main surface P1, to ground second main surface P2 (that is, a total thickness of ground semiconductor layer 1 and epitaxial layer 2) and D represents a depth from third main surface P3 to bottom portion BT, because an amount of warpage of semiconductor substrate 10 can further be lessened. From a point of view of less warpage, depth D satisfies more preferably a condition of T>D>0.6 T and particularly preferably a condition of T>D>0.7 T.

As second main surface P2 is mechanically ground with a grinder, a process-damaged layer in which crystal structure has been damaged is generated from second main surface P2 to a certain depth. Since this process-damaged layer is different from semiconductor layer 1 (a base material) in mechanical properties, it is a factor of generation of warpage in the substrate. Therefore, such a process-damaged layer is desirably removed through dry etching. Even though the process-damaged layer has been removed, however, a residual stress in epitaxial layer 2 has not been eliminated and it is difficult to decrease an amount of warpage to such an extent that yield is improved. In contrast, in the present embodiment, formation of trench TR eliminates also a residual stress in epitaxial layer 2 and hence an amount of warpage of the substrate can be decreased to 400 μm or smaller.

[Electrode Layer Forming Step (S104)]

Figure 5:
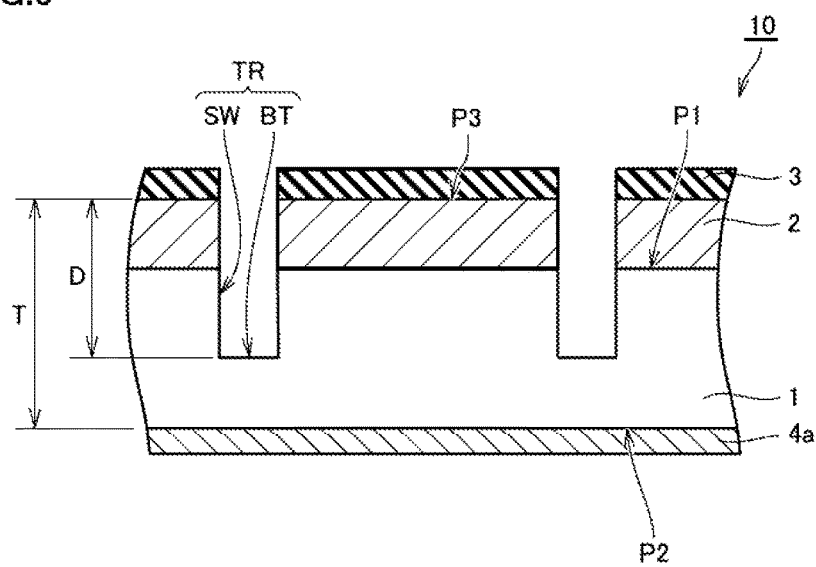
FIG. 5 is a schematic partial cross-sectional view illustrating an electrode layer forming step according to one embodiment of the present invention.

FIG. 5 is a schematic partial cross-sectional view illustrating the electrode layer forming step. Referring to FIG. 5, in this step, electrode layer 4a is formed on ground second main surface P2.

Electrode layer 4a is formed, for example, with sputtering or vacuum vapor deposition. When semiconductor layer 1 is an SiC layer, for example, nickel-silicon (NiSi) is suitable for electrode layer 4a. Here, when trench TR is formed to extend across first main surface P1 as described previously, an outgas is emitted through trench TR and a disadvantage resulting therefrom is prevented.

[Ohmic Contact Step (S105)]

Figure 6:
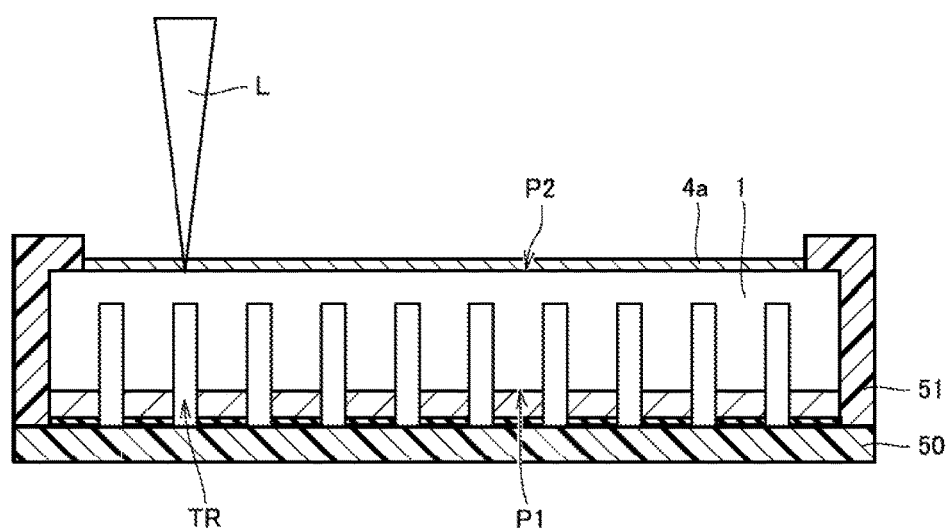
FIG. 6 is a schematic partial cross-sectional view illustrating an ohmic contact step according to one embodiment of the present invention.

FIG. 6 is a schematic diagram illustrating the ohmic contact step. Referring to FIG. 6, in this step, an interface between electrode layer 4a and second main surface P2 is irradiated with laser beams L, so as to achieve ohmic contact between electrode layer 4a and second main surface P2. In the present embodiment, laser annealing is adopted as a method of achieving ohmic contact. Thus, since ohmic contact between electrode layer 4a and second main surface P2 can be achieved even around a room temperature, an amount of warpage of the substrate can be smaller than in a case of heat treatment at a high temperature.

Referring to FIG. 6, semiconductor substrate 10 is arranged on a base 50 of a laser annealing apparatus with the first main surface P1 side facing down. Here, the first main surface P1 side may be protected by an adhesive tape (not shown). An outer peripheral portion of semiconductor substrate 10 is fixed, for example, by a jig 51. Depending on a material far semiconductor layer 1 and electrode layer 4a, intensity of emission of laser beams L is set, for example, approximately to 1 to 2 J/cm$^2$. When laser beams L having intensity at such a level are emitted to base 50, base 50 may be damaged and chippings thereof may scatter. In the present embodiment, however, trench TR does not reach second main surface P2 (the backside surface). Therefore, base 50 is not irradiated with laser beams L and preservation of the laser annealing apparatus is facilitated. In addition, foreign matters derived from base 50 can also be prevented from entering a semiconductor device.

Figure 7:
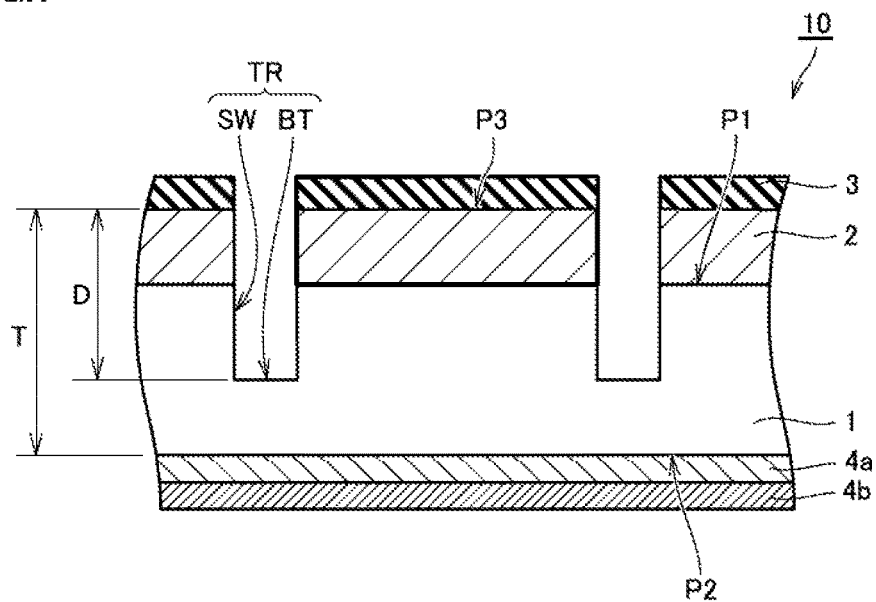
FIG. 7 is a schematic partial cross-sectional view illustrating a die-bonding electrode layer forming step according to one embodiment of the present invention.

FIG. 7 is a schematic partial cross-sectional view illustrating a die-bonding electrode layer forming step. Referring to FIG. 7, after ohmic contact between electrode layer 4a and second main surface P2 is achieved, a die-bonding electrode layer 4b may further be formed on electrode layer 4a. Die-bonding electrode layer 4b is composed, for example, of titanium-nickel-gold (TiNiAu), and can be formed with sputtering similarly to electrode layer 4a. By forming die-bonding electrode layer 4b, contact resistance is further lowered.

[Division Step (S106)]

Figure 8:
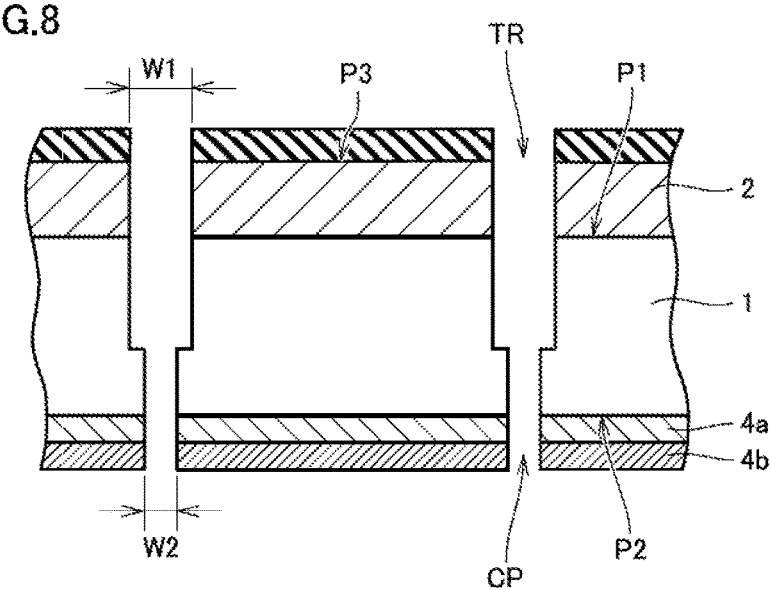
FIG. 8 is a schematic partial cross-sectional view illustrating a division step according to one embodiment of the present invention.

FIG. 8 is a schematic partial cross-sectional view illustrating the division step. Referring to FIG. 8, in this step, a dicing line (cutting portion CP) is formed along trench TR, and semiconductor substrate 10 is divided along cutting portion CP. Individual substrates 100 (chips) are thus obtained. In the present embodiment, since an amount of warpage of semiconductor substrate 10 is restricted to 400 µm or smaller owing to trench TR, occurrence of cracking or chipping during division into chips is also suppressed.

A method of forming cutting portion CP is not particularly restricted, and cutting portion CP can be formed by using electron beams, etching, or a dicing saw. In consideration of productivity, a dicing saw is most efficient.

Referring to FIG. 8, width W1 of trench TR is preferably greater than width W2 of cutting portion CP, and cutting portion CP is preferably formed in bottom portion BT of trench TR, at a distance from sidewall SW. Thus, such a disadvantage that a dicing blade comes in contact with sidewall SW and chippings scatter can be prevented. So long as division is carried out, for example, along a direction of extension of trench TR in FIG. 4, division may be carried out by forming cutting portion CP in a location where no trench TR has been formed.

Through the steps above, semiconductor devices can be manufactured with warpage of semiconductor substrate 10 being lessened, and yield thereof can be improved.

Second Embodiment

A second embodiment is directed to a semiconductor substrate (a wafer) having a diameter not smaller than 150 mm (for example, not smaller than 6 inches). This semiconductor substrate is manufactured through the substrate preparing step (S101) and the trench forming step (S102) described previously. Referring to FIG. 2 or 3, semiconductor substrate 10 in the present embodiment includes semiconductor layer 1 having first main surface P1 and second main surface P2 located opposite to first main surface P1 and epitaxial layer 2 formed on first main surface P1. Semiconductor substrate 10 further includes trench TR having sidewall SW passing through epitaxial layer 2 and reaching semiconductor layer 1 and bottom portion BT continuing to sidewall SW and located in semiconductor layer 1, and an amount of warpage is suppressed to 400 µm or smaller owing to trench TR.

In spite of the fact that semiconductor substrate 10 is a large-diameter substrate having a diameter not smaller than 150 mm, an amount of warpage is suppressed to 400 µm or smaller. Therefore, by employing this semiconductor substrate, yield of semiconductor devices can be improved and cost for manufacturing semiconductor devices can be reduced.

Semiconductor substrate 10 may have been subjected to the back-grinding step (S103) in addition to the substrate preparing step (S101) and the trench forming step (S102) described previously. Namely, second main surface P2 of semiconductor substrate 10 may be ground. Semiconductor substrate 10 has a thickness (a distance from third main surface P3 to second main surface P2) preferably not greater than 150 µm in order to lower ON resistance of a semiconductor device. From a point of view of ON resistance, semiconductor substrate 10 has a thickness more preferably not greater than 125 µm and particularly preferably not greater than 100 µm.

Third Embodiment

Figure 9:
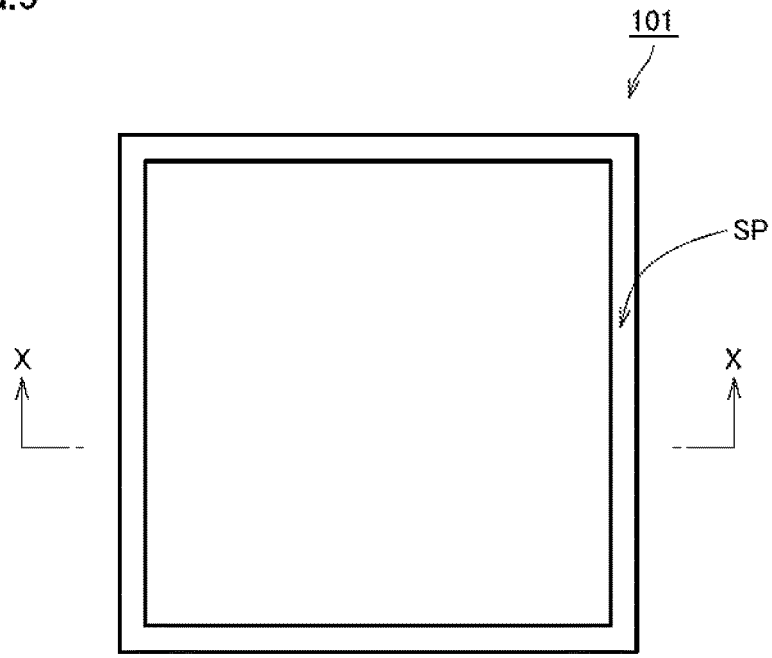
FIG. 9 is a schematic plan view showing one example of a construction of a semiconductor device according to one embodiment of the present invention.
Figure 10:
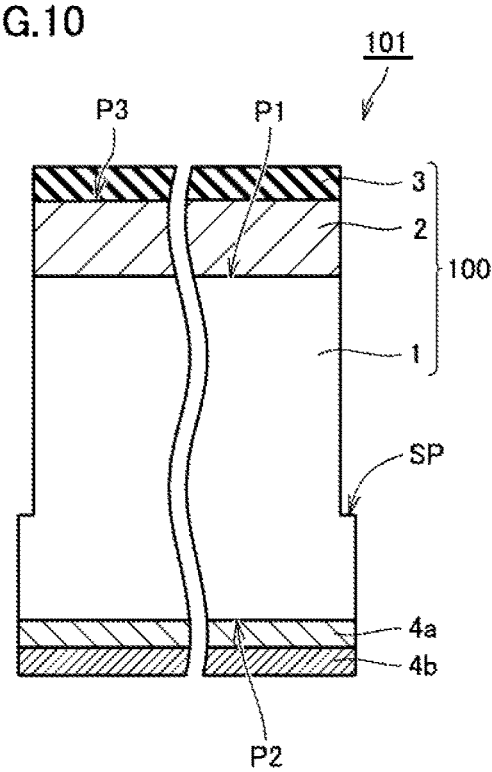
FIG. 10 is a schematic partial cross-sectional view along the line X-X in FIG. 9.

A third embodiment is directed to a semiconductor device (a chip) obtained with the manufacturing method in the first embodiment. FIG. 9 is a schematic plan view showing one example of a construction of a semiconductor device 101 according to the present embodiment. FIG. 10 is a schematic cross-sectional view along the line X-X in FIG. 9.

Referring to FIGS. 9 and 10 semiconductor device 101 includes individual substrate 100 including semiconductor layer 1 having first main surface P1 and second main surface P2 located opposite to first main surface P1 and epitaxial layer 2 formed on first main surface P1, and has step SP at an end portion of semiconductor layer 1. Furthermore, semiconductor device 101 includes insulating film 3 formed on epitaxial layer 2 (on third main surface P3), electrode layer 4a on second main surface P2, and die-bonding electrode layer 4b on electrode layer 4a.

Since step SP is provided at the end portion of semiconductor layer 1 in semiconductor device 101, second main surface P2 is greater in area than first main surface P1. Therefore, during die-bonding, the semiconductor device can be fixed onto a support in a stable manner.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor substrate having a diameter not smaller than 150 mm, comprising:
   a semiconductor layer comprising a SiC layer, a sapphire layer or a diamond layer, the semiconductor layer having a first main surface and a second main surface located opposite to said first main surface;
   an epitaxial layer formed on said first main surface; and
   a trench having a sidewall passing through said epitaxial layer and reaching said semiconductor layer and a bottom portion continuing to said sidewall and located in said semiconductor layer,
   said semiconductor substrate having an amount of warpage not greater than 400 μm.

2. The semiconductor substrate according to claim 1, having a thickness not greater than 150 μm.

3. The semiconductor substrate according to claim 1, wherein the semiconductor layer comprises a SiC layer.

4. A semiconductor device, comprising an individual substrate including a semiconductor layer comprising a SiC layer, a sapphire layer or a diamond layer, the semiconductor layer having a first main surface and a second main surface located opposite to said first main surface and an epitaxial layer formed on said first main surface, and having a step at an end portion of said semiconductor layer.

5. The semiconductor device according to claim 4, wherein the semiconductor layer comprises a SiC layer.

* * * * *